United States Patent
Komatsu et al.

(10) Patent No.: US 8,802,534 B2
(45) Date of Patent: Aug. 12, 2014

(54) METHOD FOR FORMING SOI SUBSTRATE AND APPARATUS FOR FORMING THE SAME

(75) Inventors: Yoshihiro Komatsu, Kanagawa (JP); Tomoaki Moriwaka, Kanagawa (JP); Kojiro Takahashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 150 days.

(21) Appl. No.: 13/488,854

(22) Filed: Jun. 5, 2012

(65) Prior Publication Data

US 2012/0322228 A1 Dec. 20, 2012

(30) Foreign Application Priority Data

Jun. 14, 2011 (JP) ................................. 2011-132378
Oct. 21, 2011 (JP) ................................. 2011-232029

(51) Int. Cl.
*H01L 21/331* (2006.01)
*H01L 21/8222* (2006.01)
*H01L 21/84* (2006.01)
*H01L 21/762* (2006.01)

(52) U.S. Cl.
CPC ............ *H01L 21/84* (2013.01); *H01L 21/7624* (2013.01); *H01L 21/76254* (2013.01); *Y10S 438/967* (2013.01)
USPC .... 438/311; 438/479; 438/967; 257/E21.561; 257/E21.564

(58) Field of Classification Search
CPC ................ H01L 21/84; H01L 21/7624; H01L 21/76254
USPC .................. 438/311, 479, 967; 257/E21.561, 257/E21.564
See application file for complete search history.

(56) References Cited

U.S. PATENT DOCUMENTS

| | | |
|---|---|---|
| 5,374,564 A | 12/1994 | Bruel |
| 6,013,563 A | 1/2000 | Henley et al. |

(Continued)

FOREIGN PATENT DOCUMENTS

| | | |
|---|---|---|
| JP | 2000-012864 A | 1/2000 |
| JP | 2000-124092 | 4/2000 |

(Continued)

OTHER PUBLICATIONS

Lu.F et al., "Ion-Cutting of Si Onto Glass by Pulsed and Direct-Current Plasma Immersion Ion Implantation,", J. Vac. Sci. Technol. B (Journal of Vacuum Science & Technology B), 2003, vol. 21, No. 5, pp. 2109-2113.

*Primary Examiner* — Long K Tran
(74) *Attorney, Agent, or Firm* — Eric J. Robinson; Robinson Intellectual Property Law Office, P.C.

(57) ABSTRACT

A bond substrate is attached with an incline toward the setting surface of a base substrate. Accordingly, an attachment starting portion can be limited. Further, the bond substrate is provided so that part of the bond substrate extends beyond a support base and the part is closest to the base substrate. Because of this, part of the bond substrate is separated from the support base with the use of an end portion of the support base as a fulcrum point because the support base is not provided below the contact portion, and attachment sequentially proceeds from a portion which gets close to the base substrate; thus, stable attachment can be performed without an air layer remaining at the interface between the bond substrate and the base substrate.

10 Claims, 9 Drawing Sheets

(56) References Cited

U.S. PATENT DOCUMENTS

| | | |
|---|---|---|
| 6,127,702 A | 10/2000 | Yamazaki et al. |
| 6,242,320 B1 | 6/2001 | So |
| 6,271,101 B1 | 8/2001 | Fukunaga |
| 6,312,797 B1 | 11/2001 | Yokokawa et al. |
| 6,335,231 B1 | 1/2002 | Yamazaki et al. |
| 6,372,609 B1 | 4/2002 | Aga et al. |
| 6,380,046 B1 | 4/2002 | Yamazaki |
| 6,388,652 B1 | 5/2002 | Yamazaki et al. |
| 6,468,923 B1 | 10/2002 | Yonehara et al. |
| 6,602,761 B2 | 8/2003 | Fukunaga |
| 6,686,623 B2 | 2/2004 | Yamazaki |
| 6,778,164 B2 | 8/2004 | Yamazaki et al. |
| 6,803,264 B2 | 10/2004 | Yamazaki et al. |
| 6,875,633 B2 | 4/2005 | Fukunaga |
| 6,908,797 B2 | 6/2005 | Takano |
| 7,119,365 B2 | 10/2006 | Takafuji et al. |
| RE39,484 E | 2/2007 | Bruel |
| 7,176,525 B2 | 2/2007 | Fukunaga |
| 7,176,528 B2 | 2/2007 | Couillard et al. |
| 7,192,844 B2 | 3/2007 | Couillard et al. |
| 7,199,024 B2 | 4/2007 | Yamazaki |
| 7,256,776 B2 | 8/2007 | Yamazaki et al. |
| 7,399,681 B2 | 7/2008 | Couillard et al. |
| 7,473,971 B2 | 1/2009 | Yamazaki et al. |
| 7,476,576 B2 | 1/2009 | Yamazaki et al. |
| 7,476,940 B2 | 1/2009 | Couillard et al. |
| 7,508,034 B2 | 3/2009 | Takafuji et al. |
| 7,535,053 B2 | 5/2009 | Yamazaki |
| 7,605,053 B2 | 10/2009 | Couillard et al. |
| 7,619,250 B2 | 11/2009 | Takafuji et al. |
| 7,632,739 B2 | 12/2009 | Hebras |
| 7,709,309 B2 | 5/2010 | Moriwaka |
| 7,790,570 B2 | 9/2010 | Yamazaki |
| 7,816,736 B2 | 10/2010 | Yamazaki |
| 7,834,398 B2 | 11/2010 | Yamazaki |
| 7,838,935 B2 | 11/2010 | Couillard et al. |
| 7,867,873 B2 | 1/2011 | Murakami et al. |
| 7,978,190 B2 | 7/2011 | Yamazaki et al. |
| 2002/0109144 A1 | 8/2002 | Yamazaki |
| 2003/0183876 A1 | 10/2003 | Takafuji et al. |
| 2004/0061176 A1 | 4/2004 | Takafuji et al. |
| 2004/0104424 A1 | 6/2004 | Yamazaki |
| 2005/0009252 A1 | 1/2005 | Yamazaki et al. |
| 2005/0260800 A1 | 11/2005 | Takano |
| 2006/0038228 A1 | 2/2006 | Aitken et al. |
| 2006/0099773 A1 | 5/2006 | Maa et al. |
| 2006/0110899 A1 | 5/2006 | Bourdelle et al. |
| 2007/0020947 A1 | 1/2007 | Daval et al. |
| 2007/0063281 A1 | 3/2007 | Takafuji et al. |
| 2007/0087488 A1 | 4/2007 | Moriwaka |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0291022 A1 | 12/2007 | Yamazaki et al. |
| 2008/0061301 A1 | 3/2008 | Yamazaki |
| 2008/0067529 A1 | 3/2008 | Yamazaki |
| 2008/0171443 A1 | 7/2008 | Hebras |
| 2008/0213953 A1 | 9/2008 | Yamazaki |
| 2008/0246109 A1 | 10/2008 | Ohnuma et al. |
| 2008/0286941 A1 | 11/2008 | Yamazaki |
| 2008/0286942 A1 | 11/2008 | Yamazaki |
| 2008/0286952 A1* | 11/2008 | Miyairi et al. ............... 438/517 |
| 2009/0023267 A1 | 1/2009 | Daval et al. |
| 2009/0023271 A1 | 1/2009 | Couillard et al. |
| 2009/0095956 A1 | 4/2009 | Takafuji et al. |
| 2010/0019242 A1 | 1/2010 | Takafuji et al. |
| 2011/0076837 A1* | 3/2011 | Miyairi et al. ............... 438/458 |
| 2012/0025274 A1 | 2/2012 | Ohnuma et al. |

FOREIGN PATENT DOCUMENTS

| | | |
|---|---|---|
| JP | 2005-252244 A | 9/2005 |
| WO | WO-2008/087516 | 7/2008 |

* cited by examiner

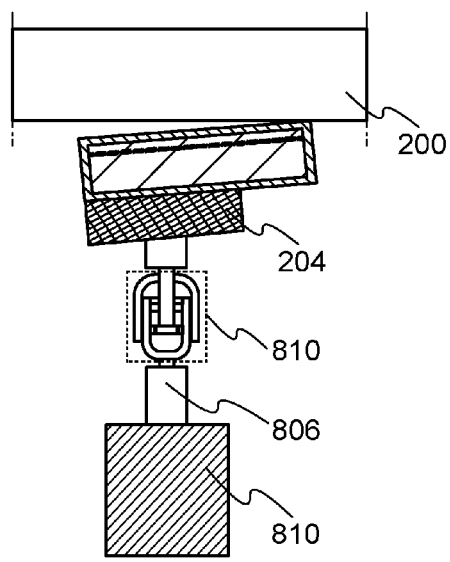 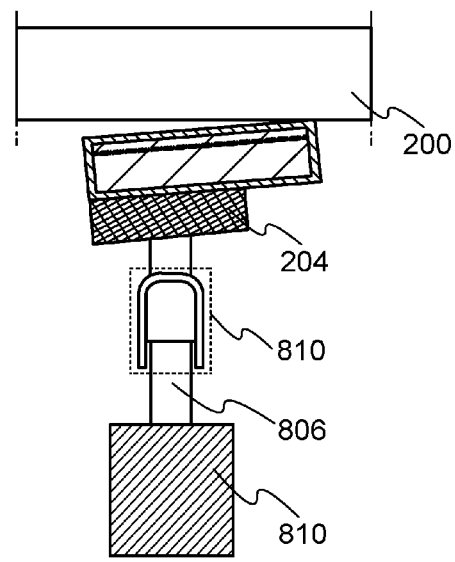

METHOD FOR FORMING SOI SUBSTRATE AND APPARATUS FOR FORMING THE SAME

BACKGROUND OF THE INVENTION

1. Field of the Invention

The present invention relates to a method for forming an SOI substrate and an apparatus for forming the SOI substrate.

2. Description of the Related Art

Instead of a silicon wafer which is manufactured by thinly slicing an ingot of a single crystal semiconductor, a semiconductor on insulator (hereinafter abbreviated to SOI) substrate in which a thin semiconductor layer is provided on an insulating surface is manufactured and is used for manufacturing semiconductor integrated circuit elements or the like.

As a method for forming an SOI substrate, a hydrogen ion implantation separation method is known (for example, see Patent Document 1). A hydrogen ion implantation separation method is performed as follows: first, an insulating thin film (e.g., a thermal oxidation film) is formed on a surface of a bond substrate (e.g., a single crystal silicon wafer) and hydrogen ions are added from a face of the bond substrate, so that a microbubble region in which dangling bonds of silicon are terminated by added hydrogen ions is formed at a predetermined depth which is the neighborhood of the face. Then, another substrate (hereinafter, referred to as a base substrate), e.g., a silicon wafer or a glass substrate, is attached to the surface of which has the microbubble region and heat treatment is performed. Accordingly, hydrogen ions in the bond substrate are concentrated in the microbubble region and a cleavage phenomenon occurs in the microbubble region. Then, the bond substrate is removed from the base substrate, so that part of the bond substrate which is more on the one of the surfaces side than the cleaved surface (hereinafter, referred to as a thin bond layer) can be transferred to the base substrate with the insulating thin film interposed between the bond substrate and the base substrate.

REFERENCE

Patent Document

[Patent Document 1] Japanese Published Patent Application No. 2000-124092

SUMMARY OF THE INVENTION

When an SOI substrate is formed by the above-described method, a bond substrate is in contact with a base substrate at one portion, so that spontaneous attachment of the bond substrate to the base substrate starts from the contact portion (hereinafter, also referred to as an attachment starting portion) as a starting point. This attachment is performed under the action of the Van der Waals force or hydrogen bonding and can be performed at room temperature.

However, when an air layer remains at the interface between the bond substrate and the base substrate in the attachment, a region in which a thin bond layer is not transferred to the base substrate at the time of removing the bond substrate from the base substrate (hereinafter, the region is referred to as a transfer defect region) is generated; thus, an area which can be used for an SOI substrate is reduced, which is a problem. Further, when semiconductor devices are formed using the SOI substrates, there is a problem in that the number of semiconductor devices obtained is reduced.

In view of the foregoing problems, in this specification, one object of one embodiment is to provide a method for forming a high quality SOI substrate in which generation of transfer defect regions due to an air layer remaining at the interface between the bond substrate and the base substrate is suppressed and to provide an apparatus for forming the SOI substrate.

As one of the causes of the air layer remaining at the interface between the bond substrate and the base substrate in the attachment treatment, a case where a plurality of attachment starting portions is generated can be supposed.

Accordingly, in the present invention, a method for attaching a bond substrate to a base substrate is devised so as to prevent a plurality of attachment starting portions from being generated. Further, a structure of an apparatus used for the attachment is devised. Specifically, attachment is performed with the use of an apparatus having a structure in which the bond substrate is inclined toward the setting surface of the base substrate when the base substrate and the bond substrate are attached to their respective support bases. Accordingly, an attachment starting portion can be limited.

Further, the bond substrate is provided so that part of the bond substrate extends beyond the lower support base and that the part is closest to the base substrate. In this state, when the bond substrate and the base substrate are in contact with each other and pressing force is applied to the contact portion, part of the bond substrate is separated from the lower support base with the use of an end portion of the lower support base as a fulcrum point because the lower support base is not provided below the contact portion. This attachment of the bond substrate to the base substrate is performed under the action of the Van der Waals force or hydrogen bonding; thus, attachment sequentially proceeds from a portion in which the bond substrate is separated from the lower support base and gets close to the base substrate. Because of this, a plurality of contact portions is prevented from being generated and stable attachment can be performed without an air layer remaining at the interface between the bond substrate and the base substrate.

That is, an embodiment of the present invention is a method for forming an SOI substrate, which is performed as follows: a base substrate is set to an upper support base; a bond substrate on the entire surfaces of which an insulating layer is formed and which includes a microbubble region is set to a lower support base so that at least an end portion of the bond substrate extends beyond the lower support base; the bond substrate is made close to the base substrate with the bond substrate inclined toward the setting surface of the base substrate so that part of the end portion is in contact with the base substrate first; the part of the end portion is in contact with the base substrate and pressing force is applied to the contact portion and periphery of the contact portion, so that part of the bond substrate is separated from the lower support base with the use of an end portion of the lower support base as a fulcrum point and the bond substrate is spontaneously attached to the base substrate; the bond substrate is heated; and the bond substrate is separated from the base substrate, so that part of the bond substrate and the insulating layer which is formed on the entire surfaces of the bond substrate are transferred to the base substrate.

With the forming method, a high quality SOI substrate in which generation of transfer defect regions which are generated when the bond substrate is separated from the base substrate is suppressed can be fabricated because stable attachment can be performed without an air layer remaining at the interface between the bond substrate and the base substrate.

Further, in the above-described method for forming an SOI substrate, a base substrate to which a plurality of bond substrates can be attached without overlaps is used, and the plurality of bond substrates is attached to the base substrate, heated, and separated from the base substrate. Thus, part of the plurality of bond substrates and the insulating layer which is formed on the entire surfaces of the plurality of bond substrates are transferred to the base substrate. In this manner, a large-sized SOI substrate can be formed.

Further, in the above-described method for forming an SOI substrate, it is preferable that the bond substrate is set to the lower support base so that the area of the bond substrate extending beyond the lower support base is larger than or equal to 5% and smaller than or equal to 50% of the area of the bond substrate. In the case where the extending area is smaller than 5% of the area of the bond substrate, at the time of separating the bond substrate from the lower support base, strong force is applied to part of the bond substrate, so that the bond substrate might be broken or cracked in some cases because of load concentration. When the extending area is larger than 50% of the area of the bond substrate, the bond substrate is not stably set to the lower support base and stable attachment treatment is difficult to perform. Accordingly, yield for an SOI substrate might be reduced.

Further, in the above-described method for forming an SOI substrate, an incline of the bond substrate toward the base substrate is larger than 0° and smaller than 3°, so that the base substrate is in contact with part of an end portion of the bond substrate. Thus, the bond substrate can be smoothly and stably attached to the base substrate.

Further, in the above-described method for forming an SOI substrate, the lower support base includes a heating apparatus, and heat treatment can be performed with the heating apparatus before or in attachment; accordingly, the attachment intensity of the bond substrate to the base substrate can be increased. Further, productivity of SOI substrates can be increased. For example, the bond substrate is heated at a temperature lower than heating temperature which is needed for forming a cleavage surface, so that the bond substrate can be rapidly heated to the temperature which is needed for forming a cleavage surface after the attachment is performed.

Further, an embodiment of the present invention is an attachment apparatus including an upper support base to which a base substrate is set and a lower support base to which a bond substrate is set. The area of the surface of the upper support base to which the base substrate is set is larger than the area of the surface of the lower support base to which the bond substrate is set. The upper support base has a function of holding the base substrate. The lower support base is inclined toward the upper support base. The incline formed by a surface of the base substrate facing the bond substrate and a surface of the bond substrate facing the base substrate is greater than 0° and smaller than 3° when the bond substrate is set to the lower support base and the base substrate is set to the upper support base.

When an apparatus used for attachment of substrates has such a structure, stable attachment without an air layer remaining at the interface between the bond substrate and the base substrate can be performed. Thus, an SOI substrate formed with the apparatus can be a high quality SOI substrate in which generation of transfer defect regions is separated from the bond substrate from the base substrate is suppressed.

Further, when the above-described apparatus for attachment of substrates has a structure including a plurality of lower support bases, a plurality of bond substrates can be attached to a base substrate in one-time attachment treatment; thus, an SOI substrate having a large area can be formed in a short time.

Further, in the above-described attachment apparatus, when either or both of the lower support base and the upper support base include a heating apparatus, heat treatment before and after attachment can be performed with the bond substrate set to the lower support base and/or with the base substrate set to the upper support base; thus, a time for forming an SOI substrate can be shortened.

Further, the above-described attachment apparatus has a structure in which the lower support base moves in the Z axis direction (also referred to as the up-and-down direction) when load is applied to the lower support base in the direction approximately perpendicular to the lower support base. Accordingly, even when some of the plurality of bond substrates are thick, force is prevented from being applied to the thick bond substrates in attachment of the plurality of bond substrates to the base substrate. Thus, an SOI substrate with high yield can be formed.

The attachment apparatus for forming an SOI substrate and the method for forming the SOI substrate which are described in the present invention are applied, so that generation of transfer defect regions due to an air layer remaining at the interface between the bond substrate and the base substrate in removing the bond substrate from the base substrate is suppressed. Accordingly, a high quality SOI substrate can be fabricated.

BRIEF DESCRIPTION OF THE DRAWINGS

FIGS. 9A and 9B each illustrate an attachment apparatus used for forming an SOI substrate.

DETAILED DESCRIPTION OF THE INVENTION

Figure 1A:
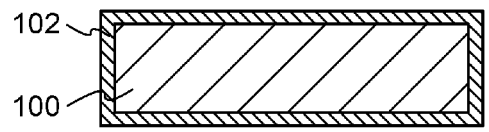
FIGS. 1A to 1D illustrate a method for forming an SOI substrate.

Embodiments of the present invention are described in detail with reference to the accompanying drawings. Note that the present invention is not limited to the following description, and it is easily understood by those skilled in the art that various changes and modifications can be made without departing from the spirit and scope of the present invention. Therefore, the present invention should not be construed as being limited to the description in the following Embodiments. Note that in the structure of the present invention described below, portions that are identical or portions having similar functions in different drawings are denoted by the same reference numerals, and their repetitive description is omitted.

(Embodiment 1)

In this embodiment, a method for forming a high quality SOI substrate in which generation of transfer defect regions due to an air layer remaining at the interface between a bond substrate and a base substrate in removing the bond substrate from the base substrate is suppressed, and an apparatus used for forming the SOI substrate are described.

First, a bond substrate 100 is prepared, and an insulating layer 102 is formed on a surface of the bond substrate 100 (see FIG. 1A). As the bond substrate 100, it is possible to use a bond substrate formed of a Group 14 element, such as a single crystal silicon substrate, a single crystal germanium substrate, or a single crystal silicon germanium substrate, for example. Further, a compound semiconductor substrate using gallium arsenide, indium phosphide, or the like can be used. A commercially-available silicon substrate is typically a circular substrate having a size of 5 inches (125 mm) in diameter, 6 inches (150 mm) in diameter, 8 inches (100 mm) in diameter, 12 inches (300 mm) in diameter, and 16 inches (400 mm) in diameter. Note that the shape of the bond substrate 100 is not limited to a circular shape, and the bond substrate 100 may be a substrate that is processed into a rectangular shape or the like, for example. Further, the bond substrate 100 can be formed by the Czochralski (CZ) method or the floating zone (FZ) method.

The insulating layer 102 may be formed with a single layer of a silicon oxide film, a silicon oxynitride film, or the like, or a stacked layer of any of these films, for example. As a method for forming the insulating layer 102, a thermal oxidation method, a CVD method, a sputtering method, or the like can be used. When the insulating layer 102 is formed by a CVD method, a silicon oxide film is preferably formed using organosilane such as tetraethoxysilane (abbreviation: TEOS, chemical formula: $Si(OC_2H_5)_4$) in order to obtain favorable attachment.

Note that in the case where the insulating layer 102 is formed by thermal oxidation treatment, the thermal oxidation treatment is preferably performed in an oxidizing atmosphere to which halogen is added.

For example, by performing a thermal oxidation treatment on the bond substrate 100 in an oxidizing atmosphere to which chlorine (Cl) is added, the insulating layer 102 can be formed through chlorine oxidation. In this case, the insulating layer 102 is a film containing chlorine atoms. By such chlorine oxidation, a heavy metal (e.g., Fe, Cr, Ni, or Mo) that is extrinsic impurities are trapped and a chloride of the metal is formed, which is then removed to the outside; thus, contamination of the bond substrate 100 can be reduced. Moreover, after the bond substrate 100 is attached to a base substrate 200, impurities such as Na from the base substrate are fixed, and contamination of the bond substrate 100 can be prevented.

Note that the halogen atoms contained in the insulating layer 102 are not limited to chlorine atoms. The insulating layer 102 may contain fluorine atoms. As a method for performing fluorine oxidation on the surface of the bond substrate 100, there is a method in which the bond substrate 100 is soaked in an HF solution and then subjected to a thermal oxidation treatment in an oxidizing atmosphere, a method in which the thermal oxidation treatment is performed in an oxidizing atmosphere to which $NF_3$ is added, or the like.

Further, it is preferable that the surface of the bond substrate 100 is cleaned with hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before forming the insulating layer 102.

Figure 1B:
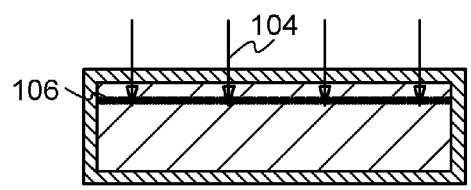

Then, ion implantation treatment 104 is performed from a surface of the bond substrate 100, so that a microbubble region 106 is formed at a predetermined depth in the bond substrate 100 (see FIG. 1B).

Hydrogen ions may be used for ion species to be added. When hydrogen ions are added, the proportion of $H_3^+$ is preferably set high. Specifically, it is preferable that the proportion of $H_3^+$ in the total amount of $H^+$, $H_2^+$, and $H_3^+$ is set 50% or higher (more preferably, 80% or higher). With a high proportion of $H_3^+$, the efficiency of ion irradiation can be improved. Further, rare gas ions can be used as well as hydrogen ions. Specifically, helium ions, neon ions, argon ions, krypton ions, and xenon ions can be used.

The depth at which the microbubble region 106 is formed can be controlled by the kinetic energy, mass, charge, or incidence angle of the ions to be added, or the like. The microbubble region 106 is formed at approximately the same depth as the average penetration depth of the ions. Thus, by adjusting the kind of ion species to be added and the condition of the addition of ions, the thickness of a thin bond layer 110 to be separated from the bond substrate 100 can be adjusted.

The thickness of the thin bond layer 110 to be separated is not particularly limited, but is preferably greater than or equal to 1 nm and less than or equal to 100 nm, more preferably greater than or equal to 3 nm and less than or equal to 30 nm because in the case where the thin bond layer 110 having too large thickness is used for forming a high performance semiconductor integrated circuit, a transistor might be normally on. Accordingly, the average penetration depth of the ions to be added is preferably adjusted so that the depth at which the microbubble region 106 is formed in the bond substrate 100 is greater than or equal to 1 nm and less than or equal to 100 nm, more preferably greater than or equal to 3 nm and less than or equal to 30 nm.

The ion implantation treatment 104 can be performed with an ion doping apparatus or an ion implantation apparatus. With an ion implantation apparatus, ion species in plasma are subjected to mass separation, and only ion species having a certain mass can be added to a semiconductor substrate, so that entry of impurities which affect the characteristics of a transistor can be reduced. Thus, an ion implantation apparatus is especially preferable.

However, even when the ion implantation treatment 104 is performed with the use of an ion doping apparatus, substances which affect the characteristics of a transistor (e.g., heavy metal) can be trapped by the insulating layer 102 with the ion implantation treatment 104 performed through the insulating layer 102.

Note that heat treatment for restoring a crystal defect may be performed after the ion implantation treatment 104. A temperature of this heat treatment is to be a temperature at which separation due to hydrogen concentration in the microbubble region 106 does not occur. For example, this heat treatment may be performed at a temperature higher than or equal to 200° C. and lower than 400° C. The heat treatment can be performed using a diffusion furnace, a heating furnace such as a resistance heating furnace, a rapid thermal annealing (RTA) apparatus, a microwave heating apparatus, or the like. Note that the above-described temperature condition is just an example, a temperature may be adjusted as appropriate in accordance with materials to be used for the bond substrate 100, ion species to be added to the bond substrate 100, or the like, and the present invention is not construed as being limited to the above range.

Then, the base substrate 200 is prepared. A substrate made of an insulator can be used as the base substrate 200. Specifically, various glass substrates that are used in the electronics industry such as those made of aluminosilicate glass, aluminoborosilicate glass, or barium borosilicate glass and a quartz substrate can be given. In particular, when the above-described variety of glass substrates is used as the base substrate 200, a manufacturing cost of a semiconductor device formed using an SOI substrate can be reduced because the base substrate 200 can be increased in size and glass substrates are inexpensive.

Further, as the base substrate 200, a film having heat resistance of higher than or equal to 300° C. (e.g., a polyimide film), a prepreg (e.g., a glass fiber impregnated with a polyimide resin), a metal plate, or a metal foil can be used. Since these substrates have flexibility, a semiconductor device formed using an SOI substrate formed by the forming method described in this embodiment can have flexibility.

As the base substrate 200, a substrate larger than the bond substrate 100 is preferably used. Specifically, the area of the base substrate 200 is preferably large enough so that a plurality of bond substrates 100 can be attached to the base substrate 200 without overlaps. Further, the area of the base substrate 200 is preferably more than twice as large as the area of the bond substrate 100. Accordingly, a large-sized SOI substrate can be formed and a lot of semiconductor devices can be fabricated from one SOI substrate; thus, a manufacturing cost of semiconductor devices can be reduced.

A surface of the base substrate 200 is preferably cleaned in advance. Specifically, the base substrate 200 is subjected to ultrasonic cleaning using hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like. By performing such cleaning treatment, flatness of the surface of the base substrate 200 can be improved and abrasive particles or organic materials remaining on the surface of the base substrate 200 can be removed.

Further, before the bond substrate 100 is attached to the base substrate 200, surfaces to be attached are preferably subjected to a surface treatment. As the surface treatment, wet treatment, dry treatment, or a combination of wet treatment and dry treatment can be used. Alternatively, wet treatment may be used in combination with different wet treatment or dry treatment may be used in combination with different dry treatment. The surface treatment can improve the bond strength at the bond interface between the bond substrate 100 and the base substrate 200.

Then, the surface of the bond substrate 100, which is subjected to the ion implantation treatment 104, is attached to the base substrate 200. If a plurality of attachment starting portions is generated in the bond substrate 100 and the base substrate 200 in the attachment, an air layer remains at the interface between the bond substrate 100 and the base substrate 200 in spontaneous attachment in some cases. Thus, this embodiment employs a method in which the bond substrate 100 is attached with an incline toward the setting surface of the base substrate 200.

Here, the above-described phrase "the bond substrate 100 is attached with an incline toward the setting surface of the base substrate 200" preferably satisfies at least one of the following two cases. One case is, as illustrated in a schematic view of FIG. 3A, a case in which an incline of an X axis of the bond substrate 100 toward a Z axis of the base substrate 200 is preferably larger than 0° and smaller than 3°, more preferably larger than or equal to 0.01° and smaller than or equal to 2° when an incline of an X axis or a Y axis toward a Z axis of the base substrate 200 is 0°. The other case is, as illustrated in a schematic view of FIG. 3B, a case in which an incline of a Y axis of the bond substrate 100 toward a Z axis of the base substrate 200 is preferably larger than 0° and smaller than 3°, more preferably larger than or equal to 0.01° and smaller than or equal to 2° when an incline of an X axis or a Y axis toward a Z axis of the base substrate 200 is 0°. Further, the phrase further preferably satisfies both of the above-described cases, that is, a case (not illustrated) in which an incline of each of an X axis and a Y axis of the bond substrate 100 toward a Z axis of the base substrate 200 is preferably larger than 0° and smaller than 3°, more preferably larger than or equal to 0.01° and smaller than or equal to 2° when an incline of an X axis or a Y axis toward a Z axis of the base substrate 200 is 0°.

An example of an apparatus used for the above-described attachment is described with reference to FIGS. 8A and 8B.

Figure 8A:
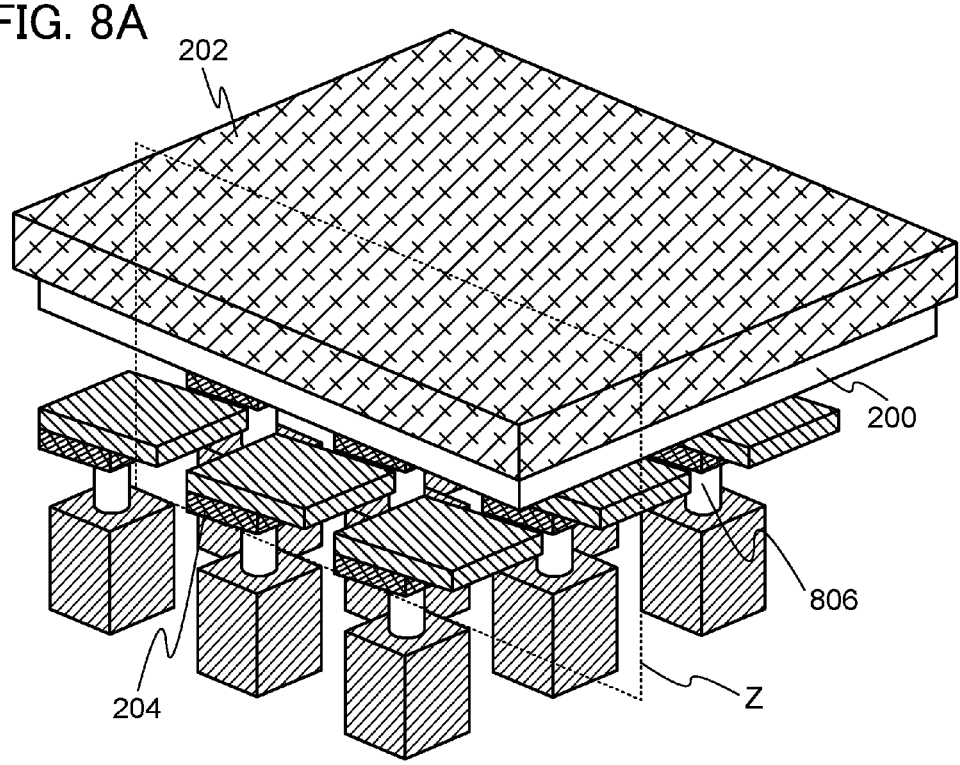
FIGS. 8A and 8B illustrate an attachment apparatus used for forming an SOI substrate.
Figure 8B:
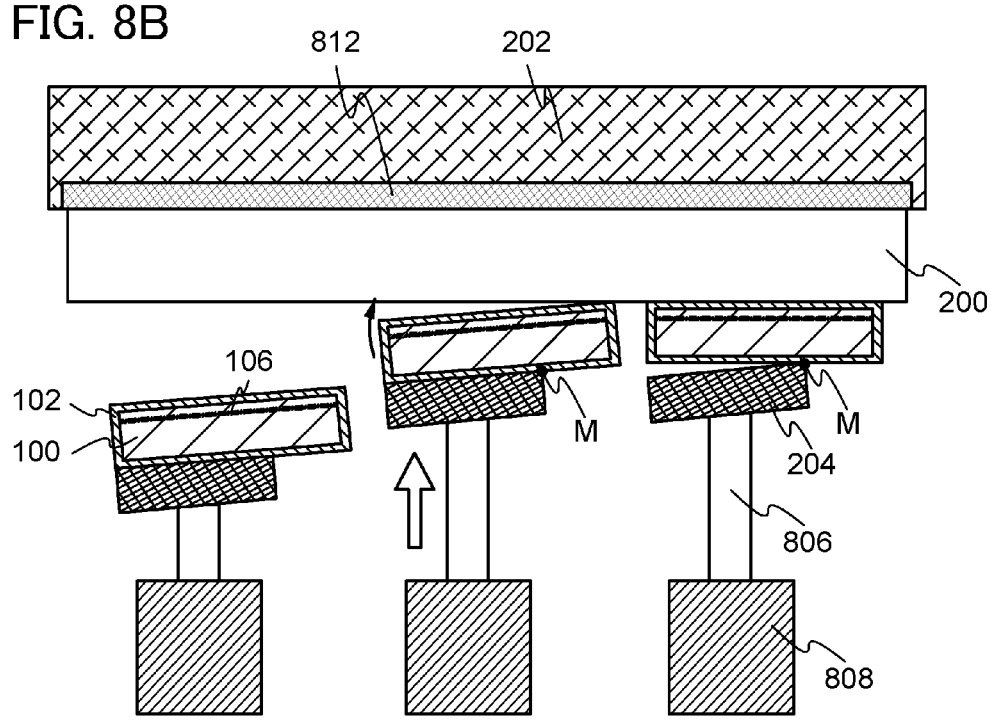

FIG. 8A is a perspective view illustrating an example of an attachment apparatus according to this specification, and FIG. 8B is a cross-sectional view when the attachment apparatus in FIG. 8A is divided by the Z surface indicated by a dotted line.

The attachment apparatus illustrated in FIGS. 8A and 8B includes an upper support base 202 to which the base substrate 200 is set and lower support bases 204 to which a bond substrate 100 provided with the insulating layer 102 and the microbubble region 106 is set. The lower support base 204 is connected to a driving device 808 through an axis 806, and as indicated by an arrow in FIG. 8B, the lower support base 204 can move in the Z axis direction (also referred to as the up-and-down direction).

The lower support base 204 is moved in the Z axis direction, and the move in the Z axis direction is stopped when part of the bond substrate 100 is in contact with the base substrate 200, so that attachment spontaneously proceeds by the Van der Waals force or hydrogen bonding of the bond substrate 100 and the base substrate 200.

The lower support base 204 is preferably made to move in the Z axis direction when load is applied to the lower support base 204 in the direction approximately perpendicular to a setting surface of the upper support base 202 to which the base substrate 200 is set. Note that the term "approximately perpendicular" includes a range within ±10° from the perpendicular direction. To make such a structure, the axis 806 may include a movable portion so as to move in the Z axis direction when force is applied to the axis 806. For example, as illustrated in FIG. 9A, a movable portion 810 (e.g., a variety of cylinders such as a hydraulic cylinder or an air pressure cylinder) may be provided in the axis 806. Further, as illustrated in FIG. 9B, the movable portion 810 (e.g., a sponge formed using urethane or the like, rubber (e.g., natural rubber or synthetic rubber), or the like) may be provided in the axis 806.

As described above, when the movable portion 810 is provided as the part of the axis 806, for example, when a plurality of bond substrates 100 having different thicknesses is attached to the base substrates 200 at once, load applied to a thick bond substrate (that is, a substrate of which the timing to be in contact with the base substrate is early) can be diffused, and load can be equivalently applied to the plurality of bond substrates 100; thus, yield in attachment treatment can be increased. Note that the number of the movable portions 810 to be provided and the position thereof are not particularly limited as long as the lower support base 204 can move in the Z axis direction.

The area of the surface of the upper support base 202 to which the base substrate 200 is set is preferably larger than the area of the surface of the lower support base 204 to which the bond substrate 100 is set. With such a structure, the plurality of bond substrates 100 can be attached to the base substrate 200 at once. In this manner, even in the case where the base substrate 200 has a large area, the attachment of the bond substrates 100 to the base substrate 200 can be performed for a short time. Further, a large area of the base substrate 200 can be used as SOI substrates. Note that in the structure of the apparatus illustrated in FIGS. 8A and 8B, up to nine bond substrates 100 can be attached to the base substrate 200 at once; however, it is needless to say that the number of attached substrates is not limited thereto.

Note that the attachment apparatus described in this embodiment has a structure in which the lower support bases 204 move in the Z axis direction with corresponding driving devices 808; however, a structure in which a plurality of lower support bases 204 moves in the Z axis direction with one driving device or a structure in which all of the support bases 204 move in the Z axis direction with one driving device may be used. With such a structure, the number of the driving devices 808 can be reduced, which leads to reduction in manufacturing cost of an attachment apparatus. Further, the attachment apparatus described in this embodiment has a structure in which the lower support bases 204 move in the Z axis direction; however, a structure in which the upper support bases 202 move in the Z axis direction may be alternatively used.

Further, a structure in which both the upper support base 202 and the lower support bases 204 move in the Z axis direction may be used. Further, one of or both of the upper support base 202 and the lower support base 204 may have a mechanism which moves in the X axis direction or Y axis direction (also referred to as a front-back direction or a left-right direction) in order to adjust the attachment position.

Further, the base substrate 200 is set to the under side of the upper support base 202; thus, a substrate fix mechanism 812 for fixing the base substrate 200 is preferably provided for the upper support base 202. As the substrate fix mechanism 812, a suction mechanism (e.g., a vacuum chuck) may be used as illustrated in FIG. 8B.

Further, a tentative fixing material (e.g., a thermal separation tape, thermal separation adhesive, a UV separation tape, or UV separation adhesive) may be set to the setting surface of the upper support base 202 to which the base substrate 200 is set as the substrate fix mechanism 812.

The lower support base 204 preferably has a structure, as described later, in which the bond substrate 100 is separated from the lower support base 204 with the use of an end portion of the lower support base 204 (a black point M in FIG. 8B) as a fulcrum point when the bond substrate 100 is in contact with the base substrate 200 and pressing force is applied to the contact portion. Therefore, the bond substrate 100 needs to be prevented from falling from the lower support base 204 when the bond substrate 100 is set to the lower support base 204 and needs to be separated from the lower support base 204 when force is applied to the bond substrate 100. Because of this, when the bond substrate 100 is set to the lower support base 204, for example, various lubber or various weak adhesion tapes (also referred to as a weak adhesion sheet) are preferably provided over the lower support base 204 in order to prevent the bond substrate 100 from falling. Note that when an incline of the lower support base 204 is small and the bond substrate 100 does not fall even when a material for preventing the bond substrate 100 from falling is not provided, the material for preventing the bond substrate 100 from falling is not necessarily provided.

Further, the lower support base 204 is preferably inclined toward the upper support base 202. As a specific angle, when the base substrate 200 is set to the upper support base 202 and the bond substrate 100 is set to the lower support base 204, the incline formed by a surface of the base substrate 200 facing the bond substrate 100 and a surface of the bond substrate 100 facing the base substrate 200 is preferably greater than 0° and smaller than 3°, more preferably greater than or equal to 0.01° and smaller than or equal to 2°.

A case in which the incline is too small is not preferable because a plurality of attachment starting portions might be generated when the upper support base 202 and the lower support base 204 are made close to each other and the bond substrate 100 is in contact with the base substrate 200. Further, in a case in which an incline of the bond substrate 100 toward the base substrate 200 is too large, even when the bond substrate 100 is in contact with the base substrate 200 and an attachment starting portion is generated, spontaneous attachment with the attachment starting portion as a starting point does not easily proceed because there is a gap between the bond substrate 100 and the base substrate 200. Accordingly, in some cases, the attachment of the bond substrate 100 to the base substrate 200 does not proceed or the part of the bond substrate 100 is not attached to the base substrate 200; thus, the case in which the incline of the bond substrate 100 toward the base substrate 200 is large is not preferable.

With the attachment apparatus having the above-described structure, a case in which the bond substrate 100 is attached to the base substrate 200 when an incline of an X axis of the bond substrate 100 toward the base substrate 200 and/or an incline of a Y axis of the bond substrate 100 toward the base substrate 200 are/is preferably larger than 0° and smaller than 3° is preferable because in the case, attachment of the bond substrate 100 to the base substrate 200 tends to start from one point, spontaneous attachment can stably proceed without an air layer remaining at the interface between the bond substrate 100 and the base substrate 200.

Figure 3A:
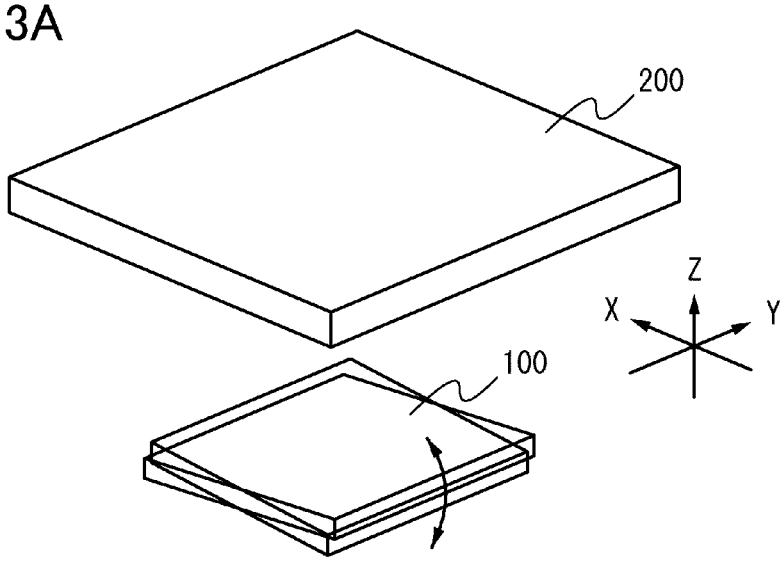
FIGS. 3A and 3B each illustrate a method for forming an SOI substrate.
Figure 3B:
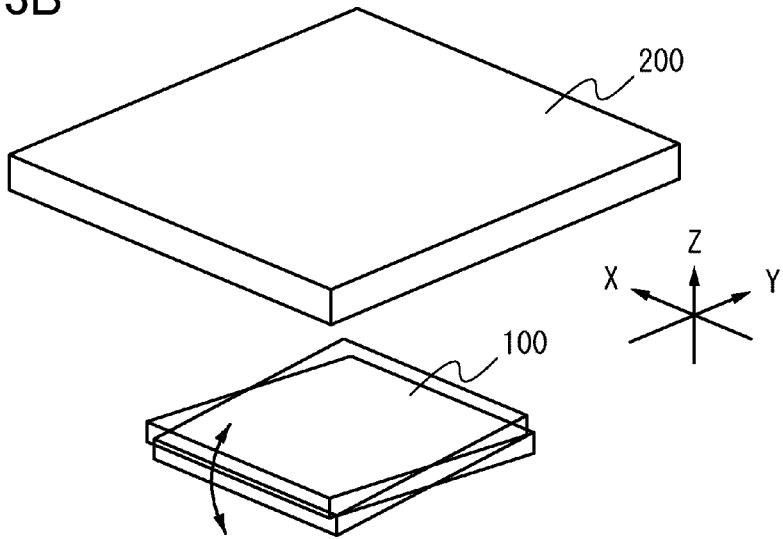

Further, the base substrate 200 and the bond substrate 100 are preferably positioned so that, as illustrated in FIGS. 3A and 3B, the bond substrate 100 is positioned below the base substrate 200. As described later, when the bond substrate 100 is in contact with the base substrate 200 and pressing force is applied to the contact portion and the periphery of the contact portion, the bond substrate 100 is separated from the lower support base with the use of the end portion of the lower support base as a fulcrum point (that is, the bond substrate 100 gets closer to the base substrate 200; for example, see FIG. 1D described in a later process). Because of this separation, spontaneous attachment of the bond substrate 100 to the base substrate 200 can stably proceed.

Although it is preferable that the bond substrate 100 is not fixed to the lower support base in order to generate the separation in the attachment treatment, when the bond substrate 100 is positioned above the base substrate 200, the bond substrate 100 needs to be fixed with the use of vacuum suction, a slightly adhesive material, or the like in order to prevent the bond substrate 100 from falling from the lower support base when the bond substrate 100 faces the base substrate 200. Because of such a reason, the base substrate 200 and the bond substrate 100 are preferably positioned so that, as illustrated in FIGS. 3A and 3B, the bond substrate 100 is positioned below the base substrate 200.

Figure 1C:
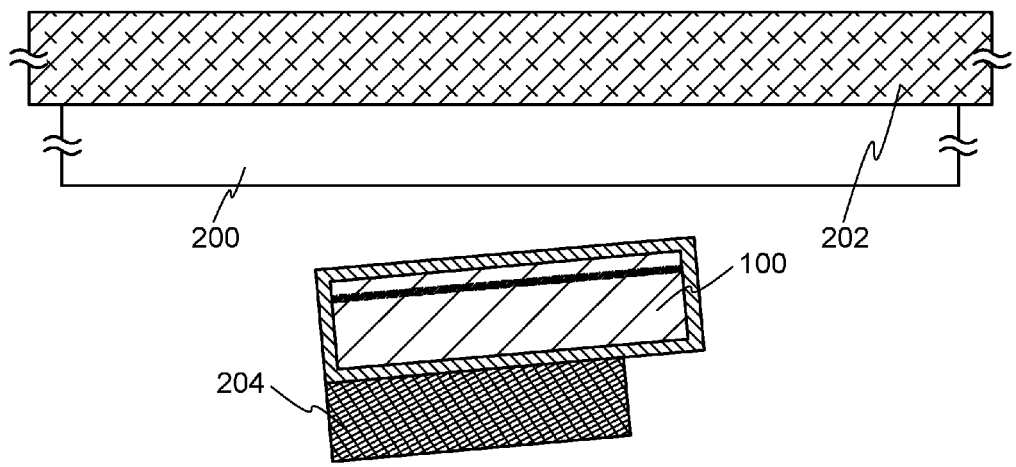

Then, the base substrate 200 is set to the upper support base 202 and the bond substrate 100 is set to the lower support base 204. Note that the bond substrate 100 is preferably set to the lower support base 204 so that part of the bond substrate 100 extends beyond the lower support base 204 and the part is closest to the base substrate 200 (see FIG. 1C).

Figure 1D:
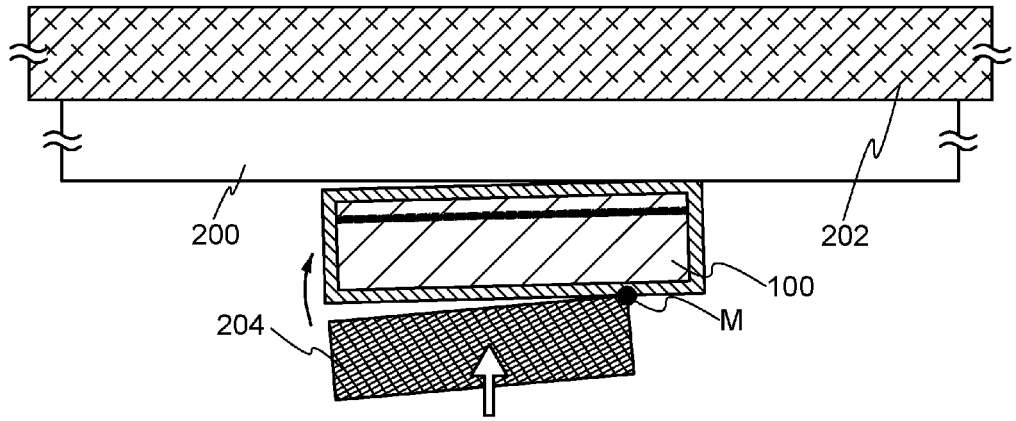

With the bond substrate 100 and the base substrate 200 provided in this manner, when the bond substrate 100 and the base substrate 200 get close to and in contact with each other and pressing force is applied to the contact portion and the periphery of the contact portion, the bond substrate 100 is separated from the lower support base 204 with the use of the end portion of the lower support base 204 as a fulcrum point indicated by a black point M in FIG. 1D (see FIG. 1D). Because of this separation, the distance between the bond substrate 100 and the base substrate 200 is made smaller, and spontaneous attachment of the bond substrate 100 to the base substrate 200 can stably proceed with the contact portion as a starting point. Accordingly, the insulating layer 102 formed on the surface of the bond substrate 100 can be attached to the base substrate 200 without an air layer remaining at the interface. The above-described "spontaneous attachment" is performed under the action of the Van der Waals force or hydrogen bonding and can be performed at room temperature.

Here, the above-described phrase "part of the bond substrate 100 extends beyond the lower support base 204" refers to a state in which the bond substrate 100 is preferably provided to the lower support base 204 so that the area of the bond substrate 100 extending beyond the lower support base 204 is larger than or equal to 5% and smaller than or equal to 50% of the area of the bond substrate 100. When the extending area is smaller than 5% of the area of the bond substrate 100, at the time of separating the bond substrate 100 from the lower support base 204, strong force is applied to part of the bond substrate 100 (particularly, part of the lower support base 204, which is in contact with a portion functioning as a fulcrum point indicated by the black point in FIG. 1D), so that the bond substrate 100 might be broken or cracked in some cases because of load concentration. When the extending area is larger than 50% of the area of the bond substrate 100, the bond substrate 100 is not stably set to the lower support base 204 and stable attachment treatment is difficult to perform in some cases; for example, the bond substrate 100 falls from the lower support base 204 when the bond substrate 100 and the base substrate 200 are in contact with each other. Accordingly, yield for an SOI substrate might be reduced.

In attachment of the bond substrate 100 to the base substrate 200, after spontaneous attachment starts from the contact portion of the bond substrate 100 and the base substrate 200 as a starting point, the operation for making the upper support base 202 get closer to the lower support base 204 is preferably stopped. This is because when the upper support base 202 gets much closer to the lower support base 204 after spontaneous attachment starts, the fulcrum point (indicated by the black point in FIG. 1D) of the lower support base 204 is strongly pressed against part of the bond substrate 100 and spontaneous attachment of the bond substrate 100 to the base substrate 200 might be prevented.

Heat treatment may be performed before and after the attachment in order to increase bonding strength between the bond substrate 100 and the base substrate 200.

As heat treatment before the attachment, the bond substrate 100 is preferably attached to the base substrate 200 while the bond substrate 100 is heated at a temperature higher than or equal to 50° C. and lower than 150° C. Further, as heat treatment after the attachment, the bond substrate 100 is preferably heated at a temperature at which separation (also referred to as a cleavage phenomenon) does not occur at the microbubble region 106 (for example, a temperature higher than or equal to 100° C. and lower than 400° C.). The heat treatment can be performed using a diffusion furnace, a heating furnace such as a resistance heating furnace, a rapid thermal annealing (RTA) apparatus, a microwave heating apparatus, or the like. The above temperature condition is merely an example, and one embodiment of the present invention should not be construed as being limited to this example.

Note that the upper support base 202 described in this embodiment may include a heating apparatus. When the upper support base 202 includes a heating apparatus, for example, the above-described heat treatment before and after the attachment can be performed with the base substrate 200 set to the upper support base 202; thus, a time for forming an SOI substrate can be shortened. Further, for example, when the upper support base 202 is heated at a temperature lower than heating temperature which is needed for forming a cleavage surface before "heat treatment for forming a cleavage surface" which is described later, the bond substrate 100 can be rapidly heated to the temperature which is needed for forming a cleavage surface just after the attachment is performed.

Further, the lower support base 204 described in this embodiment may include a heating apparatus. When the lower support base 204 includes a heating apparatus, for example, the above-described heat treatment before and after the attachment can be performed with the bond substrate 100 set to the lower support base 204; thus, a time for forming an SOI substrate can be shortened. Further, for example, when the lower support base 204 is heated at a temperature lower than heating temperature which is needed for forming a cleavage surface before "heat treatment for forming a cleavage surface" which is described later, the bond substrate 100 can be rapidly heated to the temperature which is needed for forming a cleavage surface just after the attachment is performed.

Figure 2A:
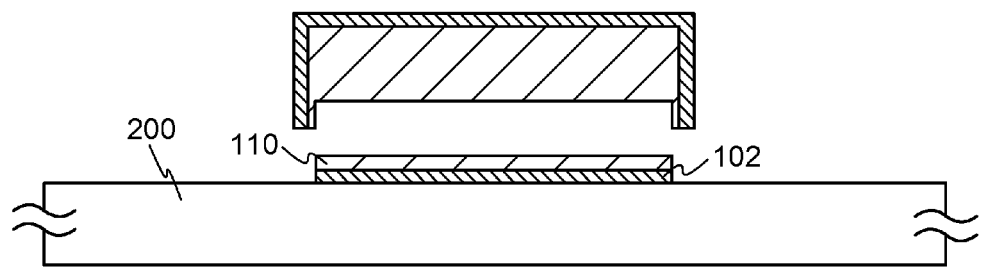
FIGS. 2A to 2C illustrate a method for forming an SOI substrate.

Then, the base substrate 200 to which the bond substrate 100 is attached is removed from the upper support base 202, and heat treatment is performed on the bond substrate 100. The heat treatment is performed, so that ions (hydrogen ions or rare gas ions) which are added to the bond substrate 100 by the ion implantation treatment 104 are concentrated in the microbubble region 106 and a cleavage phenomenon occurs in the microbubble region 106. After that, the bond substrate 100 is separated from the base substrate 200, so that the thin bond layer 110 which is separated from the bond substrate 100 at the cleavage surface is transferred over the base substrate 200 with the insulating layer 102 interposed therebetween (see FIG. 2A). Note that in the above description, the phrase "heat treatment is performed on the bond substrate 100" does not mean that only the bond substrate 100 is heated. For example, the phrase "heat treatment is performed on the bond substrate 100" also includes the case where heat treatment is performed on the base substrate 200 and the bond substrate 100 is secondarily heated.

Further, heat treatment may be performed at a temperature higher than or equal to 100° C. after the thin bond layer 110 is separated from the bond substrate 100, so that the concentration of hydrogen remaining in the thin bond layer 110 is reduced.

Figure 2B:
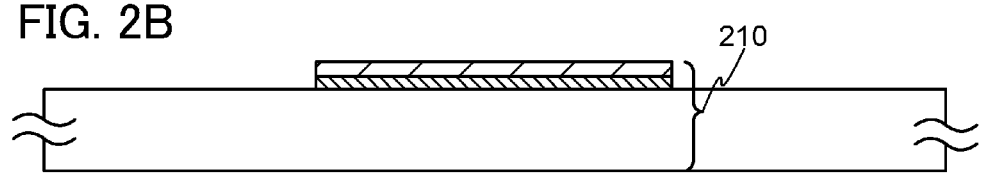

Through the above steps, a high quality SOI substrate 210 can be fabricated. In the SOI substrate 210, generation of transfer defect regions due to an air layer remaining at the interface between the bond substrate 100 and the base substrate 200 in removing the bond substrate 100 from the base substrate 200 is suppressed (see FIG. 2B).

Figure 2C:
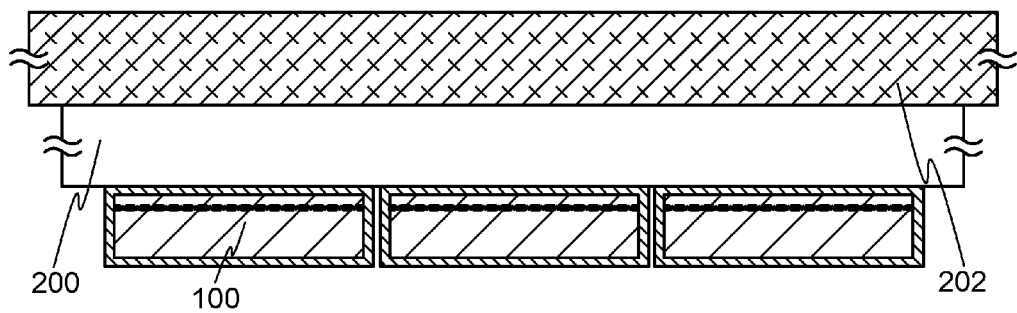

The method in which one bond substrate 100 is attached to the base substrate 200, subjected to the heat treatment, and separated is described in the above; however, as illustrated in FIG. 2C, a plurality of bond substrates 100 may be attached to the base substrate 200, subjected to the heat treatment, and separated. Accordingly, a plurality of thin bond layers 110 is formed over the base substrate 200 each with the insulating layer 102 interposed therebetween and more semiconductor devices can be fabricated from one base substrate 200; that is, the number of semiconductor devices obtained from one substrate is increased, so that a manufacturing cost of semiconductor devices can be reduced.

When a semiconductor element such as a transistor is formed using the SOI substrate formed by the method described in this embodiment, a gate insulating layer can be thinned and the localized interface state density with the gate insulating layer can be reduced. Further, when the thin bond layer 110 is formed to have small thickness, a fully depleted transistor can be fabricated.

Also, a method for forming the SOI substrate according to this embodiment permits a processing temperature to be 700° C. or lower; consequently, a glass substrate can be applied as the base substrate 200. Accordingly, a semiconductor device including the above-described high performance transistor can be fabricated over a substrate which is inexpensive and can be made large in size, such as a glass substrate.

This embodiment can be implemented combining with another embodiment as appropriate.

(Embodiment 2)

In this embodiment, a semiconductor element formed using an SOI substrate formed by the method described in Embodiment 1 is described.

Figure 4:
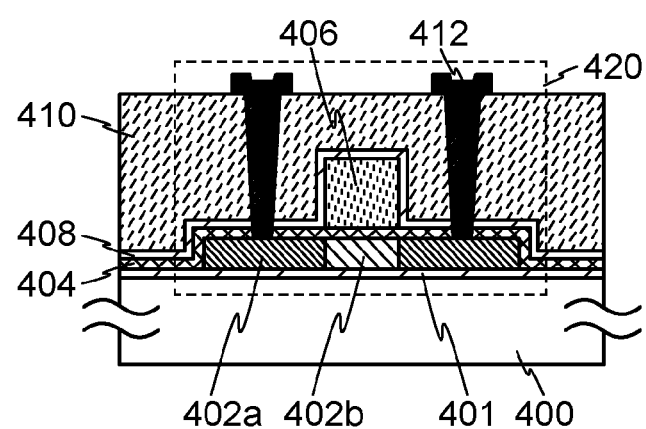
FIG. 4 illustrates a structure of a semiconductor element using an SOI substrate.

FIG. 4 illustrates a structure of a transistor 420 as an example of a semiconductor element formed using the SOI substrate 210 formed by the method described in Embodiment 1.

The transistor 420 includes a base layer 401 provided over a substrate 400, low-resistance regions 402a each functioning as a source or drain region and a channel formation region 402b sandwiched between the low-resistance regions 402a, which are provided over the base layer 401, a gate insulating layer 404 provided over the low-resistance regions 402a and the channel formation region 402b, a gate electrode 406 provided over the gate insulating layer 404, a first insulating layer 408 and a second insulating layer 410 provided over the gate insulating layer 404 and the gate electrode 406, and wiring layers 412 each functioning as a source or drain wiring and electrically connected to the low-resistance regions 402a through openings which are formed in the gate insulating layer 404, the first insulating layer 408, and the second insulating layer 410.

Figure 5A:
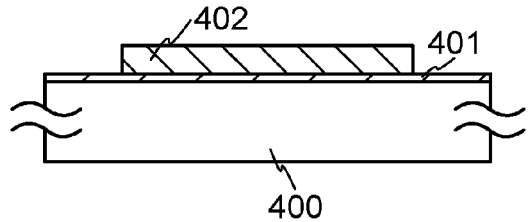
FIGS. 5A to 5D illustrate a method for manufacturing a semiconductor element using an SOI substrate.

The transistor 420 is formed using the SOI substrate 210 formed as follows. First, the thin bond layer 110 of the SOI substrate 210 formed by the method described in Embodiment 1 is processed into an island shape by a known technique such as a photolithography step or an etching method, so that a semiconductor layer 402 is formed over the base layer 401 (see FIG. 5A). Note that the base substrate 200 of the SOI substrate 210 corresponds to the substrate 400 in this embodiment, and the insulating layer 102 of the SOI substrate 210 corresponds to the base layer 401 in this embodiment. The base layer 401 has a function of suppressing diffusion of impurities (e.g., sodium) which adversely affect the characteristics of the transistor from the substrate 400 to the semiconductor layer 402.

Then, impurity elements imparting n-type conductivity or impurity elements imparting p-type conductivity are added to the semiconductor layer 402 by a known technique such as an ion implantation method. In the case where silicon is used as the semiconductor layer 402, phosphorus (P), arsenic (As), or the like can be used as the impurity elements imparting n-type conductivity. On the other hand, boron (B), aluminum (Al), gallium (Ga), or the like can be used as the impurity elements imparting p-type conductivity.

Figure 5B:
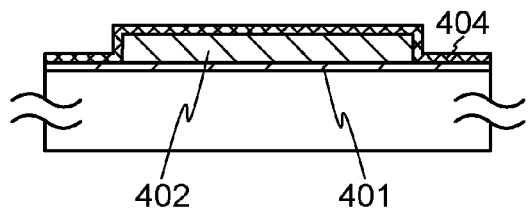

Then, the gate insulating layer 404 covering the semiconductor layer 402 is formed by a known technique such as a CVD method or a sputtering method (see FIG. 5B). The gate insulating layer 404 preferably has a single-layer structure or a stacked-layer structure with a film including silicon oxide, silicon oxynitride, silicon nitride, silicon nitride oxide, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. For example, the gate insulating layer 404 may be formed to have a thickness greater than or equal to 1 nm and less than or equal to 200 nm, preferably greater than or equal to 10 nm and less than or equal to 100 nm. For example, as the gate insulating layer 404, a stacked layer of silicon oxynitride and silicon nitride oxide may be formed to have a thickness of 50 nm by a CVD method.

Figure 5C:
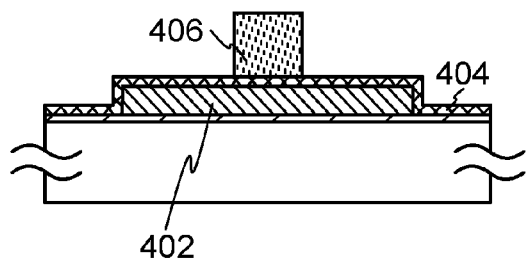

Then, a conductive layer is formed over the gate insulating layer 404 by a known technique such as a sputtering method or an evaporation method. After that, the conductive layer is patterned by a known technique such as a photolithography step or an etching method. Thus, the gate electrode 406 is formed (see FIG. 5C). The conductive layer used for the gate electrode 406 can be formed of a single layer or a stacked layer using metal materials such as aluminum, copper, titanium, tantalum, or tungsten or a nitride of any of these metal materials. The conductive layer may be formed using a semiconductor material such as polycrystalline silicon. For example, the gate electrode 406 may be formed to have a thickness greater than or equal to 10 nm and less than or equal to 1000 nm, preferably greater than or equal to 50 nm and less than or equal to 500 nm. For example, as the gate electrode 406, a stacked layer of tantalum, copper, and titanium may be formed to have a thickness of 300 nm by a sputtering method.

Figure 5D:
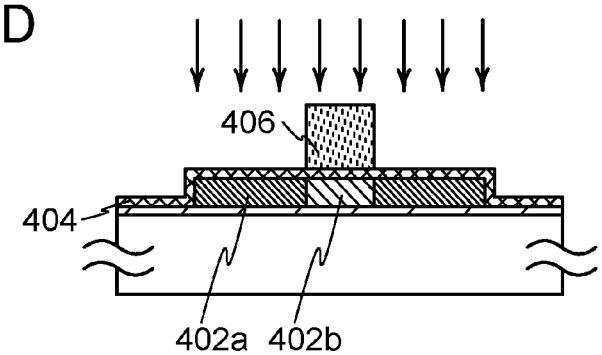

Then, impurity elements imparting one conductivity type are added to the semiconductor layer 402 by a known technique such as an ion implantation method with the gate electrode 406 as a mask, so that the low-resistance regions 402a and the channel formation region 402b are formed (see FIG. 5D). For example, impurity elements such as phosphorus (P) or arsenic (As) may be added in order to form an n-channel transistor; and impurity elements such as boron (B), aluminum (Al), or gallium (Ga) may be added in order to form a p-channel transistor. Note that, after the impurity element is added, heat treatment for activation may be performed.

Figure 6A:
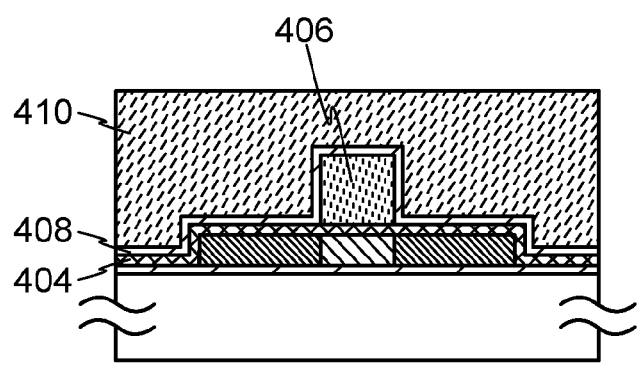
FIGS. 6A and 6B illustrate a method for manufacturing a semiconductor element using an SOI substrate.

Then, the first insulating layer 408 and the second insulating layer 410 are formed by a known technique such as a sputtering method, a CVD method, or a spin coating method (see FIG. 6A) to cover the gate insulating layer 404 and the gate electrode 406. The first insulating layer 408 and the second insulating layer 410 can be formed using an inorganic insulating material such as silicon oxide, silicon oxynitride, silicon nitride oxide, silicon nitride, or aluminum oxide. Further, the first insulating layer 408 and the second insulating layer 410 can be formed using an organic insulating material such as a polyimide resin or an acrylic resin. For example, the first insulating layer 408 and the second insulating layer 410 may be formed to have a thickness greater than or equal to 100 nm and less than or equal to 5000 nm, preferably greater than or equal to 300 nm and less than or equal to 3000 nm. For example, the first insulating layer 408 may be formed using a silicon oxide film with a thickness of 300 nm by a CVD method and then, the second insulating layer 410 may be formed using a polyimide resin with a thickness of 1000 nm by a spin coating method.

Then, the openings reaching the low-resistance regions 402a are formed in the gate insulating layer 404, the first insulating layer 408, and the second insulating layer 410 by a known technique such as a photolithography step or an etching method.

Then, a conductive layer is formed by a known technique such as a sputtering method or an evaporation method to cover the openings and after that, the conductive layer is patterned by a known technique such as a photolithography step or an etching method to form the wiring layers 412. The conductive layer for forming the wiring layers 412 can be formed using the same material and method as the gate electrode 406. For example, the conductive layer may be formed to have a thickness greater than or equal to 100 nm and less than or equal to 1000 nm, preferably greater than or equal to 200 nm and less than or equal to 800 nm. For example, as the conductive layer, a stack in which an aluminum film is sandwiched between titanium films may be formed by a sputtering method to have a thickness of 500 nm.

Figure 6B:
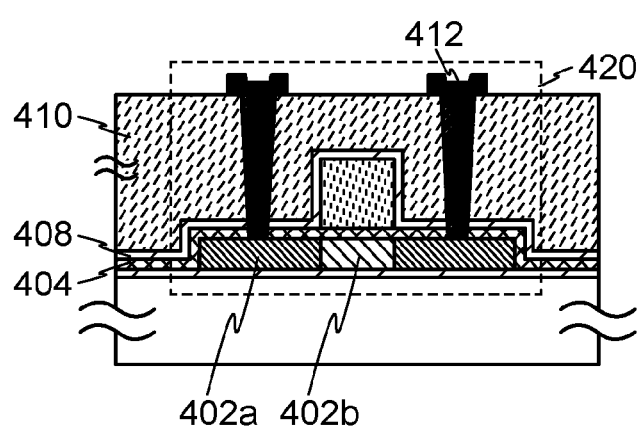

Through the above steps, the transistor 420 can be formed (see FIG. 6B). When the transistor 420 is formed using the SOI substrate 210 formed in Embodiment 1, a transistor having high mobility and stable electrical characteristics can be formed over a substrate (e.g., a glass substrate) which is inexpensive and can be increased in size.

(Embodiment 3)

In this embodiment, an example of the case where the semiconductor element formed using the SOI substrate described in the above embodiments is applied to electronic devices is described with reference to FIGS. 7A to 7C.

Figure 7A:
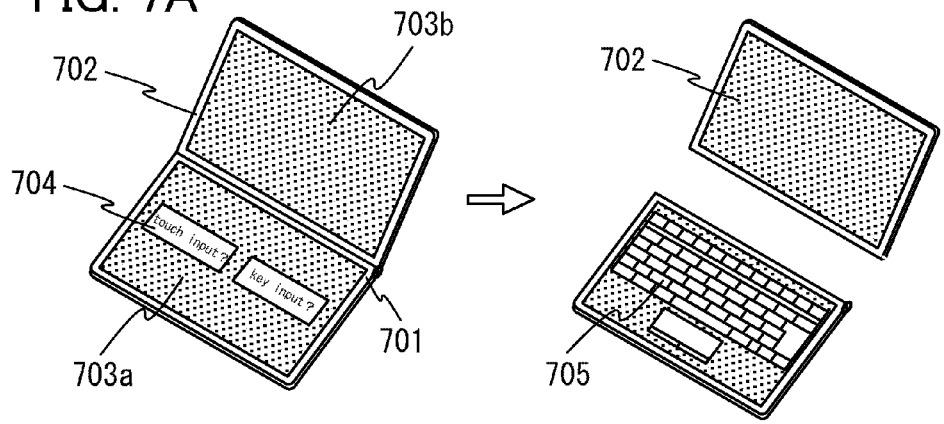
FIGS. 7A to 7C illustrate electronic devices each including a semiconductor element using an SOI substrate.

FIG. 7A illustrates a portable information terminal, which includes a housing 701, a housing 702, a first display portion 703*a*, a second display portion 703*b*, and the like. The first display portion 703*a* and the second display portion 703*b* are touch screens, and for example, as shown in a left part of FIG. 7A, which of "touch input" and "key input" is performed can be selected by a selection button 704 displayed on the first display portion 703*a*. Since the selection buttons with a variety of sizes can be displayed, the portable information terminal can be easily used by people of any generation. In the case where "touch input" is selected, for example, a keyboard 705 is displayed on the first display portion 703*a* as illustrated in a right part of FIG. 7A. With the keyboard 705, letters can be input quickly by keyboard input as in the case of using a conventional information terminal, for example.

In the portable information terminal in FIG. 7A, the first display portion 703*a* and the second display portion 703*b* can be separated from each other as illustrated in the right part of FIG. 7A. Accordingly, a user can use the housing 702 with the housing 701 put on a desk or a wall; thus, the portable information terminal is very convenient in such a case when a plurality of people uses it.

The portable information terminal illustrated in FIG. 7A can be equipped with a function of displaying various kinds of data (e.g., a still image, a moving image, and a text image), a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 7A may be equipped with a function capable of transmitting and receiving data wirelessly. Through wireless communication, desired book data or the like can be purchased and downloaded from an electronic book server.

Further, the housing 701 or the housing 702 illustrated in FIG. 7A may be equipped with an antenna, a microphone function, or a wireless communication function to be used as a mobile phone.

A transistor formed using the SOI substrate described in the above embodiments has high mobility, capability of high-speed operation, and stable electrical characteristics. Further, the transistor can be formed over a substrate (e.g., a glass substrate) which is inexpensive and can be increased in size. Accordingly, when the transistor is used for the first display portion 703*a* or the second display portion 703*b*, the first display portion 703*a* or the second display portion 703*b* can operate accurately and stably even in the case of having high definition, e.g., 4K×2K pixels (3840 pixels in the horizontal direction and 2048 pixels in the perpendicular direction) or 8K×4K pixels (7680 pixels in the horizontal direction and 4320 pixels in the perpendicular direction); thus, a very high-definition portable information terminal can be provided.

Figure 7B:
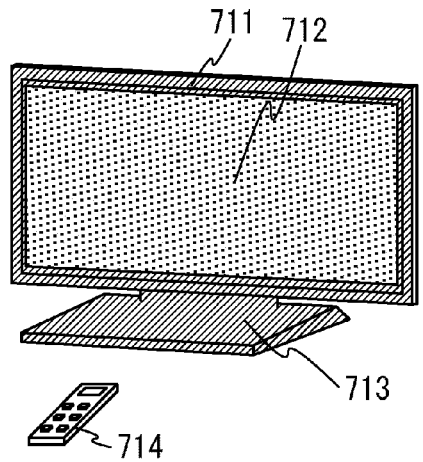

FIG. 7B is a television set including a housing 711, a display portion 712, a stand 713, and the like. The television device can be operated with a switch of the housing 711 and a separate remote controller 714. When the transistor formed using the SOI substrate described in the above embodiments is used for the display portion 712 or the like in such a television device, the display portion 712 can operate accurately and stably even in the case of having high definition, e.g., 4K×2K pixels (3840 pixels in the horizontal direction and 2048 pixels in the perpendicular direction) or 8K×4K pixels (7680 pixels in the horizontal direction and 4320 pixels in the perpendicular direction); thus, a very high-definition television device can be provided.

Figure 7C:
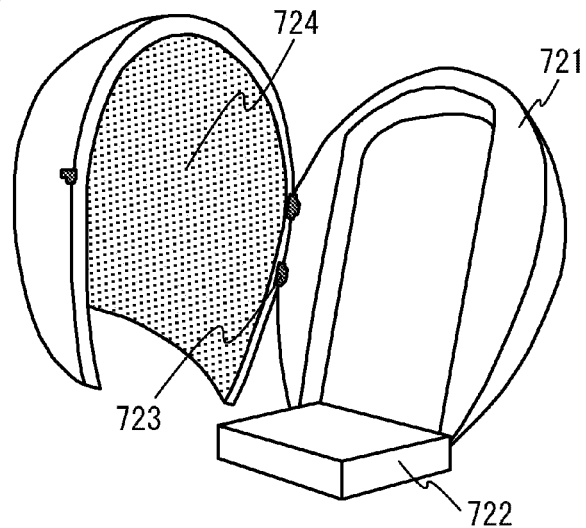

FIG. 7C illustrates a hemispherical image display device including a main body 721, a seat 722, a hinge 723, a display portion 724, and the like. The hemispherical image display device needs to have a curved display portion 724. In the method for forming the SOI substrate described in the above-described embodiments, a flexible substrate formed using a film, a prepreg, a metal plate, a metal foil, or the like can be used as the substrate 200; thus, the transistor formed using the SOI substrate described in the above-described embodiments can be used for the curved portion of the display portion 724. In the hemispherical image display device described in this embodiment, the display portion 724 is very close to a user; thus, when the display portion 724 has low definition, it cannot display realistic images. Further, when a display rate of the display portion 724 is low, afterimages are displayed in the display portion 724 in playing fast-moving images, and make the user stressed. When the transistor is used for the display portion 724, the number of pixels in the display portion 724 can be markedly increased and the display rate of images can be set high; thus, a hemispherical image display device having very high definition and offering realistic images can be provided.

This application is based on Japanese Patent Application serial No. 2011-132378 filed with Japan Patent Office on Jun. 14, 2011 and Japanese Patent Application serial No. 2011-232029 filed with Japan Patent Office on Oct. 21, 2011, the entire contents of which are hereby incorporated by reference.

What is claimed is:

1. A method for forming an SOI substrate comprising:
   setting a base substrate on an upper support base;
   setting a bond substrate on entire surfaces of which an insulating layer is formed and which comprises a microbubble region to a lower support base so that at least an end portion of the bond substrate extends beyond the lower support base;
   making the bond substrate close to the base substrate with the bond substrate inclined toward a setting surface of the base substrate so that part of the end portion of the bond substrate is in contact with the base substrate;

making the part of the end portion of the bond substrate be in contact with the base substrate and applying pressing force to a contact portion and periphery of the contact portion, so that part of the bond substrate is separated from the lower support base with the use of an end portion of the lower support base as a fulcrum point and the bond substrate is spontaneously attached to the base substrate;

heating the bond substrate; and separating the bond substrate from the base substrate, so that part of the bond substrate and the insulating layer which is formed on the entire surfaces of the bond substrate are transferred to the base substrate.

2. The method for forming an SOI substrate, according to claim 1, further comprising:

attaching a plurality of bond substrates to the base substrate;

heating the plurality of bond substrates; and separating the plurality of bond substrates from the base substrate, so that part of each of the plurality of bond substrates and insulating layers which are formed on surfaces of the plurality of bond substrates are transferred to the base substrate, wherein the base substrate is larger than the bond substrate.

3. The method for forming an SOI substrate according to claim 1, wherein the bond substrate is set to the lower support base so that an area of the bond substrate extending beyond the lower support base is larger than or equal to 5% and smaller than or equal to 50% of the area of the bond substrate.

4. The method for forming an SOI substrate according to claim 1, wherein an incline of the bond substrate toward the base substrate is larger than 0° and smaller than 3° so that the base substrate is in contact with the part of the end portion of the bond substrate.

5. The method for forming an SOI substrate according to claim 1, wherein heat treatment is performed on at least one of the base substrate and the bond substrate before, in, or after attachment of the bond substrate to the base substrate.

6. A method for forming an SOI substrate comprising:

forming an insulating layer on a bond substrate;

forming a microbubble region in the bond substrate;

setting a base substrate on an upper support base;

setting the bond substrate to a lower support base so that at least an end portion of the bond substrate extends beyond the lower support base;

making the bond substrate close to the base substrate with the bond substrate inclined toward a setting surface of the base substrate so that part of the end portion of the bond substrate is in contact with the base substrate;

making the part of the end portion of the bond substrate be in contact with the base substrate and applying pressing force to a contact portion and periphery of the contact portion, so that part of the bond substrate is separated from the lower support base with the use of an end portion of the lower support base as a fulcrum point and the bond substrate is spontaneously attached to the base substrate;

heating the bond substrate; and separating the bond substrate from the base substrate, so that part of the bond substrate and the insulating layer which is formed on the entire surfaces of the bond substrate are transferred to the base substrate.

7. The method for forming an SOI substrate, according to claim 6, further comprising:

attaching a plurality of bond substrates to the base substrate;

heating the plurality of bond substrates; and separating the plurality of bond substrates from the base substrate, so that part of each of the plurality of bond substrates and insulating layers which are formed on surfaces of the plurality of bond substrates are transferred to the base substrate, wherein the base substrate is larger than the bond substrate.

8. The method for forming an SOI substrate according to claim 6, wherein the bond substrate is set to the lower support base so that an area of the bond substrate extending beyond the lower support base is larger than or equal to 5% and smaller than or equal to 50% of the area of the bond substrate.

9. The method for forming an SOI substrate according to claim 6, wherein an incline of the bond substrate toward the base substrate is larger than 0° and smaller than 3° so that the base substrate is in contact with the part of the end portion of the bond substrate.

10. The method for forming an SOI substrate according to claim 6, wherein heat treatment is performed on at least one of the base substrate and the bond substrate before, in, or after attachment of the bond substrate to the base substrate.

* * * * *